United States Patent
Andujar

(10) Patent No.: US 9,513,326 B2
(45) Date of Patent: Dec. 6, 2016

(54) SYSTEM AND METHOD FOR MONITORING ELECTRICAL GROUND CONDITION BETWEEN A MARINE VESSEL AND A LOADING-OFFLOADING FACILITY

(71) Applicant: Juan Andujar, Vaga Alta, PR (US)

(72) Inventor: Juan Andujar, Vaga Alta, PR (US)

( * ) Notice: Subject to any disclaimer, the term of this patent is extended or adjusted under 35 U.S.C. 154(b) by 255 days.

(21) Appl. No.: 14/215,655

(22) Filed: Mar. 17, 2014

(65) Prior Publication Data

US 2014/0285928 A1    Sep. 25, 2014

Related U.S. Application Data

(60) Provisional application No. 61/790,743, filed on Mar. 15, 2013.

(51) Int. Cl.
| | | |
|---|---|---|
| G01R 31/25 | (2006.01) | |
| H02H 3/16 | (2006.01) | |
| G01R 31/02 | (2006.01) | |
| B67D 7/32 | (2010.01) | |
| G01R 31/00 | (2006.01) | |
| B67D 9/00 | (2010.01) | |

(52) U.S. Cl.
CPC .......... *G01R 31/025* (2013.01); *B67D 7/3236* (2013.01); *B67D 9/00* (2013.01); *G01R 31/008* (2013.01)

(58) Field of Classification Search
USPC .......................................... 361/42, 212, 216
See application file for complete search history.

(56) References Cited

U.S. PATENT DOCUMENTS

| | | | | |
|---|---|---|---|---|
| 2,645,201 A | * | 7/1953 | Muggleton | D21H 5/003 118/224 |
| 3,223,604 A | * | 12/1965 | Marsh | C23F 13/04 114/221 R |
| 4,092,943 A | * | 6/1978 | Lund | B63B 59/045 114/222 |
| 6,183,625 B1 | * | 2/2001 | Staerzl | C23F 13/04 204/196.01 |
| 6,822,462 B1 | * | 11/2004 | Staerzl | C23F 13/04 205/727 |
| 8,372,260 B1 | * | 2/2013 | Staerzl | C23F 13/04 204/196.02 |
| 8,864,538 B1 | * | 10/2014 | Arbuckle | B63H 21/383 440/88 C |
| 2006/0058929 A1 | * | 3/2006 | Fossen | B63B 9/001 701/21 |
| 2006/0116796 A1 | * | 6/2006 | Fossen | G05D 1/0875 701/21 |

* cited by examiner

*Primary Examiner* — Thienvu Tran
*Assistant Examiner* — Angela Brooks
(74) *Attorney, Agent, or Firm* — James Ray and Assocs; Alexander Pokot

(57) ABSTRACT

A Ship Board Ground Monitor System measures an antistatic bond between a ship and a loading-off-loading facility during operation and an earth ground while in the process of loading or unloading flammable materials. The system ensures that a maximum adjustable, preset resistance between the ship transport and safety ground is not exceeded. Should this resistance be exceeded, the control apparatus within the system will activate audible and visual annunciation and provide a contact output, which may be used to disable pumping systems.

19 Claims, 5 Drawing Sheets

SYSTEM AND METHOD FOR MONITORING ELECTRICAL GROUND CONDITION BETWEEN A MARINE VESSEL AND A LOADING-OFFLOADING FACILITY

CROSS-REFERENCE TO RELATED APPLICATIONS

This application is related to and claims priority from U.S. Provisional Patent Application Ser. No. 61/790,743 filed on Mar. 15, 2013.

FIELD OF THE INVENTION

The present invention relates, in general, to marine vessels and, more particularly, this invention relates to a system for monitoring antistatic bond between a ship and a loading-off-loading pier and an earth ground during operation.

STATEMENT REGARDING FEDERALLY SPONSORED RESEARCH AND DEVELOPMENT

N/A

REFERENCE TO SEQUENCE LISTING, A TABLE, OR A COMPUTER PROGRAM LISTING COMPACT DISC APPENDIX

N/A

BACKGROUND OF THE INVENTION

As is generally well known, proper electrical grounding must be followed in many applications, and particularly in a marine environment when loading and/or offloading marine vessels at a loading-off-loading facility, such as a pier, platform or any other like structures and yet more particularly, loading and/or unloading flammable materials, such as fuel, oil and gas. Thus, there is a need for a system configured to monitor an electrical ground condition between a marine vessel and loading-off-loading facility.

SUMMARY OF THE INVENTION

The invention provides a Ship Board Ground Monitor System that was designed to measure the antistatic bond between a ship and loading-off-loading pier during operation and an earth ground while in the process of loading or unloading flammable materials.

The system ensures that a maximum adjustable, predetermined (normally 1-4 ohms) resistance between the ship transport and safety ground is not exceeded. Should this resistance be exceeded, the control apparatus will activate audible and visual annunciation and provide a contact output, which may be used to disable pumping systems.

The Intrinsically Safe Ground Monitoring (ISGM) Ship Board Monitor System has been designed to be "fail-safe" in operation. Should either primary power to the control apparatus fail or any of the system components fail, the alarm relay will close thereby giving an alarm output until the condition is corrected.

OBJECTS OF THE INVENTION

It is, therefore, one of the primary objects of the present invention to provide a system for monitoring antistatic bond between a ship and loading-off-loading facility during operation and an earth ground.

Another object of the present invention is to provide a system for monitoring antistatic bond between a ship and loading-off-loading facility during operation and an earth ground that includes audible and visual alarms.

Yet another object of the present invention is to provide a system for monitoring antistatic bond between a ship and loading-off-loading facility during operation and an earth ground that will disable pumping of flammable material during an alarm condition.

Another object of the present invention is to provide a system for monitoring antistatic bond between a ship and a support structure for the loading-unloading facility that is partially imbedded into earth ground and generate a different electrical resistance than a connection with the loading-unloading facility structure.

In addition to the several objects and advantages of the present invention which have been described with some degree of specificity above, various other objects and advantages of the invention will become more readily apparent to those persons who are skilled in the relevant art, particularly, when such description is taken in conjunction with the attached drawing Figures and with the appended claims.

BRIEF DESCRIPTION OF THE VARIOUS EMBODIMENTS OF THE INVENTION

Figure 1:
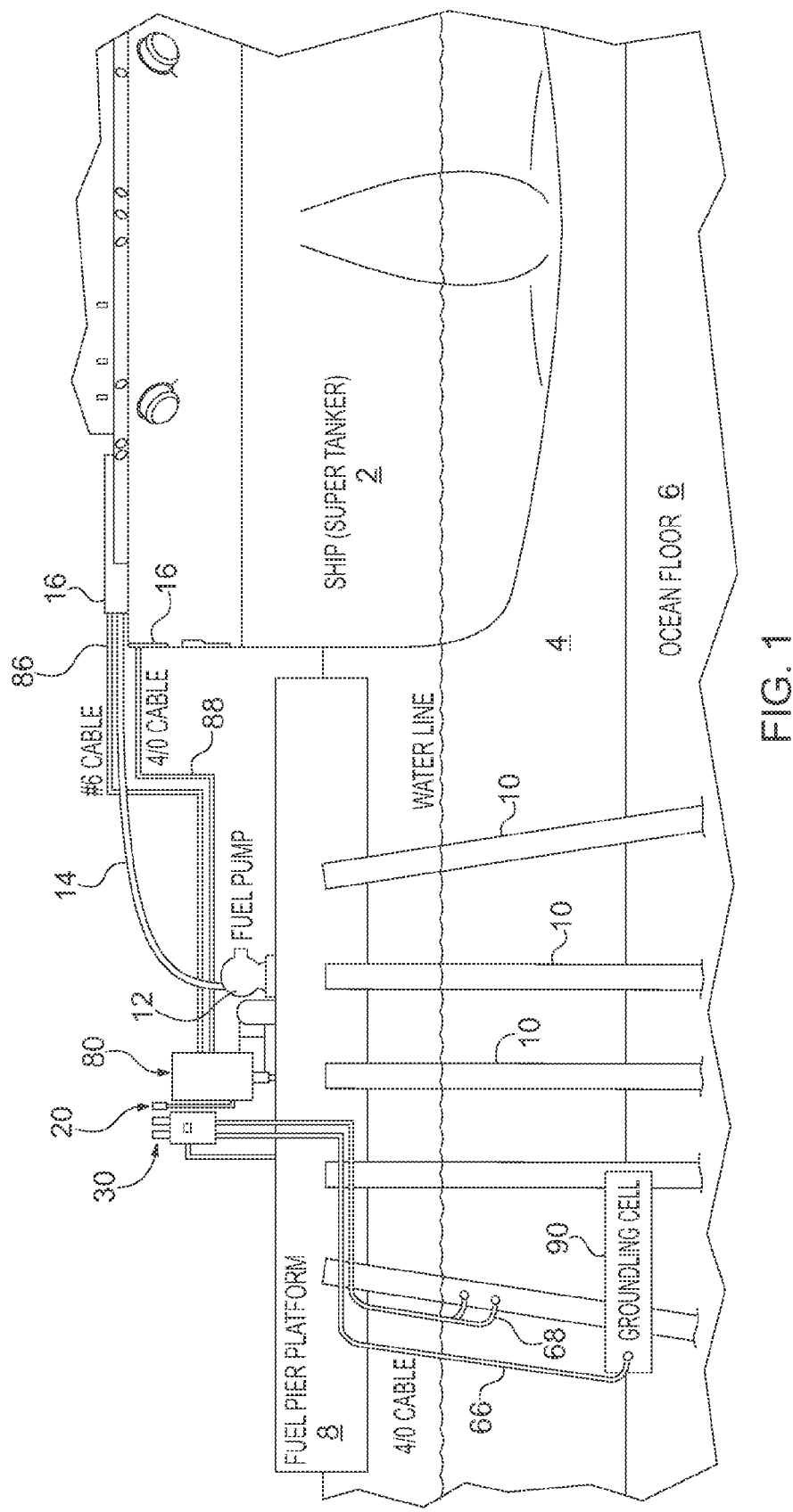
FIG. 1 illustrates environmental view of a ground monitoring system.

Prior to proceeding to the more detailed description of the present invention, it should be noted that, for the sake of clarity and understanding, identical components which have identical functions have been identified with identical reference numerals throughout the several views illustrated in the drawing figures.

Now in reference to FIGS. 1-5, therein is illustrated a Ship Board Ground Monitor System, generally designated as 20, that is configured to measure an antistatic bond or electrical equilibrium, hereinafter referred to as a "condition", between an earth ground 6 and a marine vessel 2 and/or between the marine vessel 2 and a loading-offloading facility 8 during operation, particularly while in a process of fueling the marine vessel 2 with a flammable fuel material from a fuel pump 12 connected to the marine vessel 2 by a fuel line 14. As is conventional, the marine vessel 2 is moored in a body of water 4, wherein the earth ground is represented by a floor 6 of such body of water 4. The loading-off-loading facility 8 may be a pier, offshore drilling platform and the like structure supported in any conventional manner above a water line, for example such as ground support members or pylons 10 inset into the floor 6.

More particularly, the system 20 is configured to maintain an electrical equilibrium between the marine vessel 2 and the source of electrical power from the loading-off-loading facility 8.

The essential elements of the system 20 include an electrical system control assembly or control apparatus, generally designated as 30, one or more grounding cells 90, generally buried into the ground 6, and associated electrical cables and connections.

Figure 2:
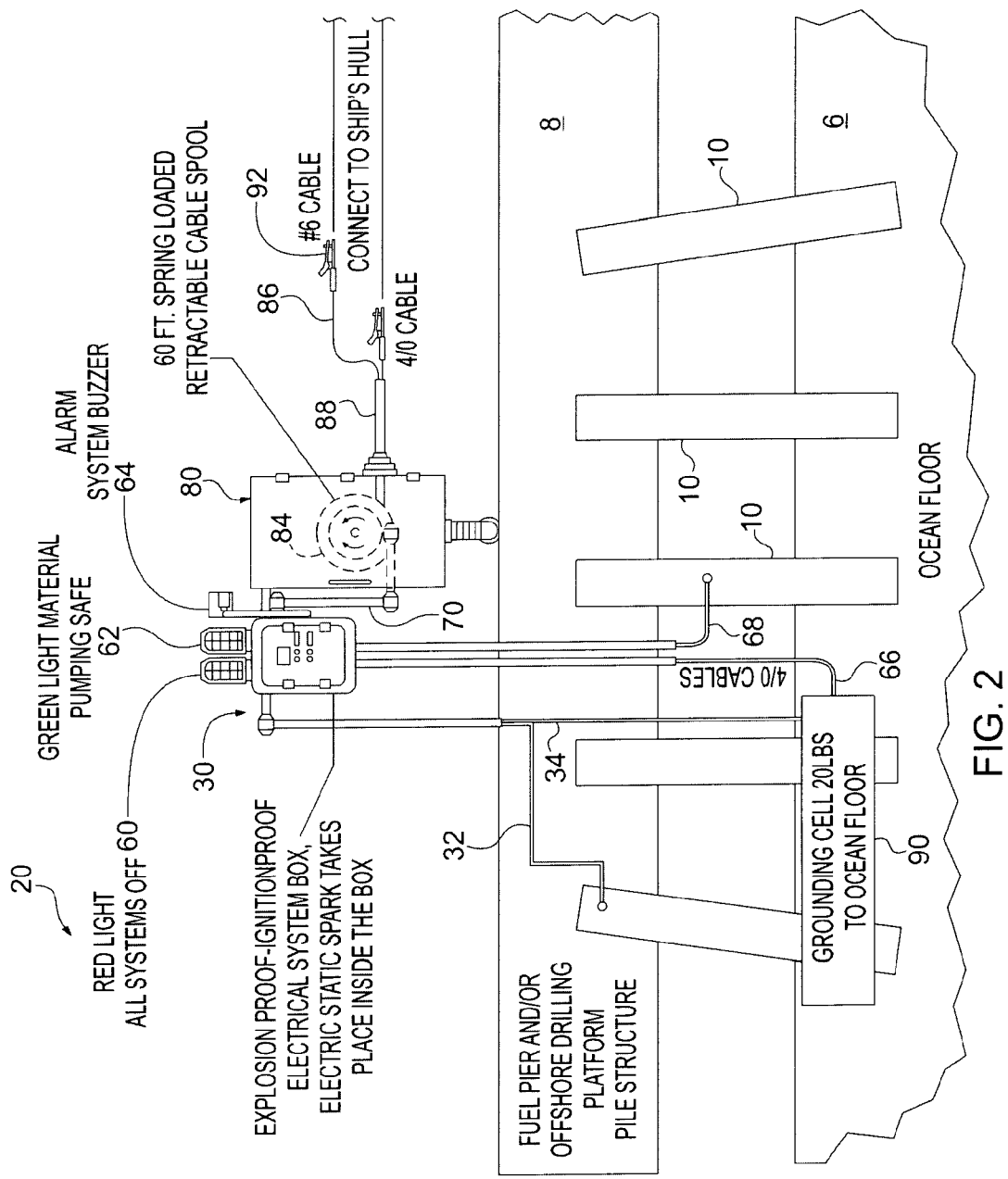
FIG. 2 is illustrates the ground monitoring system of FIG. 1 installed on a loading/offloading facility, such as a pier or platform.
Figure 3:
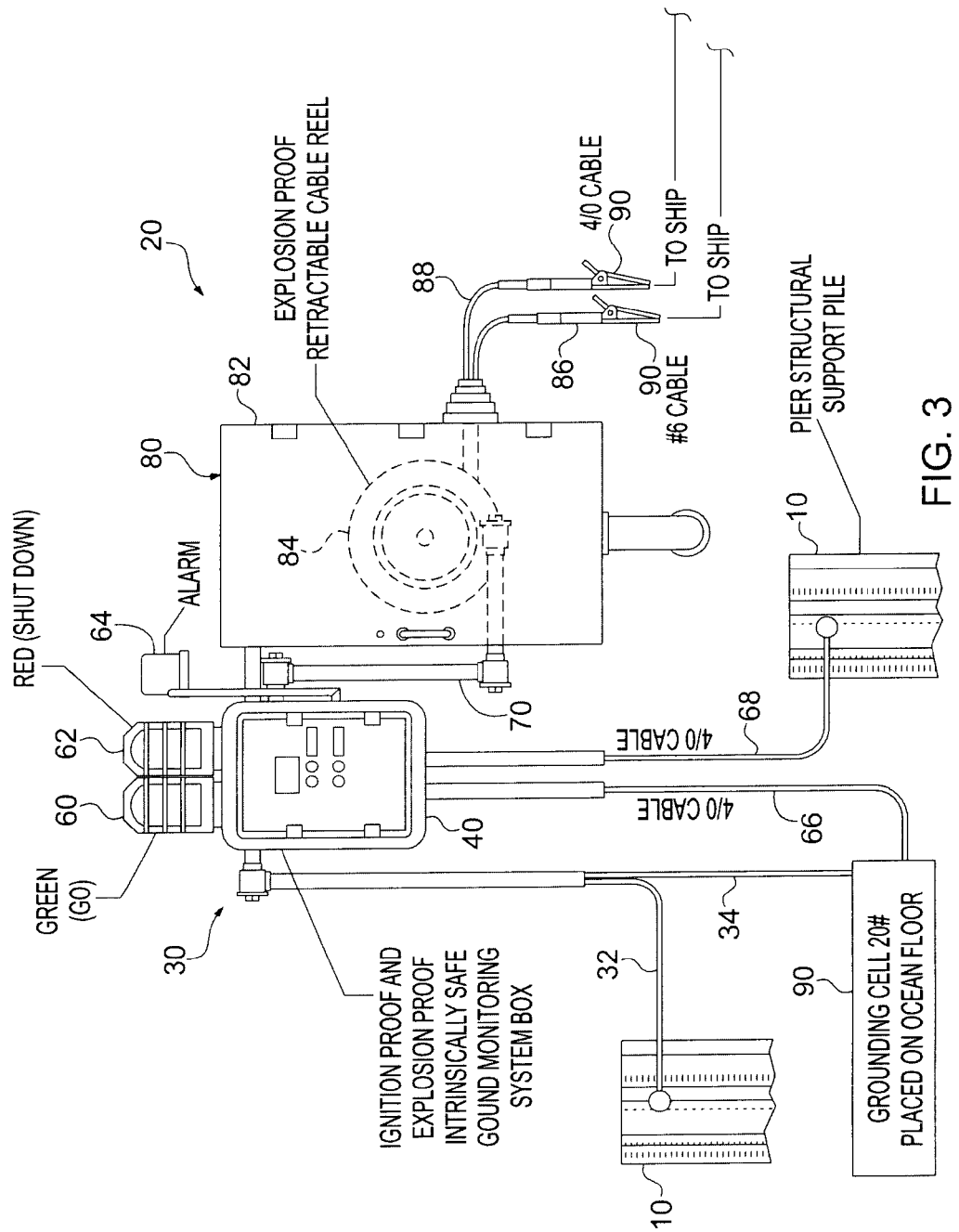
FIG. 3 is a schematic block diagram of the ground monitoring system of the invention.

Now in a more particular reference to FIGS. 2-3, the control apparatus 30 is essentially electrically coupled or connected between the loading-offloading facility 8 and ground plates 16 of the marine vessel 2 by way of a pair of wires or cables 86 and 88 equipped with conventional clamps 90. The control apparatus 30 is further coupled by way of a pair of wires or cables 32, 34 with the grounding cell 90 and support member 10 that may also include a connection with the loading-offloading facility 8 and by way of the pair of wires or cables with 66, 68 with the grounding cell 90 and another support member 10.

The system 20 is also operable in a combination with a retractable cable reel assembly, generally designated as 80, by way of connection 70. The retractable cable reel assembly 80 includes an explosion proof housing 82, a reel 84 contained within a hollow interior thereof and coupled to the pair of wires or cables 86, 88 for connection to such grounding plates 16 of the vessel 2. The invention contemplates that the retractable cable reel assembly 80 with or without wires or cables 86 and 88 can be provided integral to the system 30.

In a further reference to FIGS. 2-3, the control apparatus 30 includes a housing 40, preferably of an ignition proof and explosion proof type. The housing 40 is coupled to the wires or cables 32, 34 and to the wire or cable 70. Mounted external to the explosion proof housing 40, a "Shut Down" or a red visual indicator 60, a "Go" or green visual indicator 62, and an audible alarm 64. The "Shut Down" or the red visual indicator 60 may be operable to intermittent or flashing operation by way of a device 65.

The control apparatus 30 has a first electrical connection 66 with the grounding cell 90 and a second electrical connection 68 with a portion of a support member 10 of such loading-offloading facility 8. Preferably, the second electrical connection includes a connection to one support member 10 positioned in a proximity to a shore line and another support member 10 positioned in a proximity to the marine vessel 2.

Figure 4:
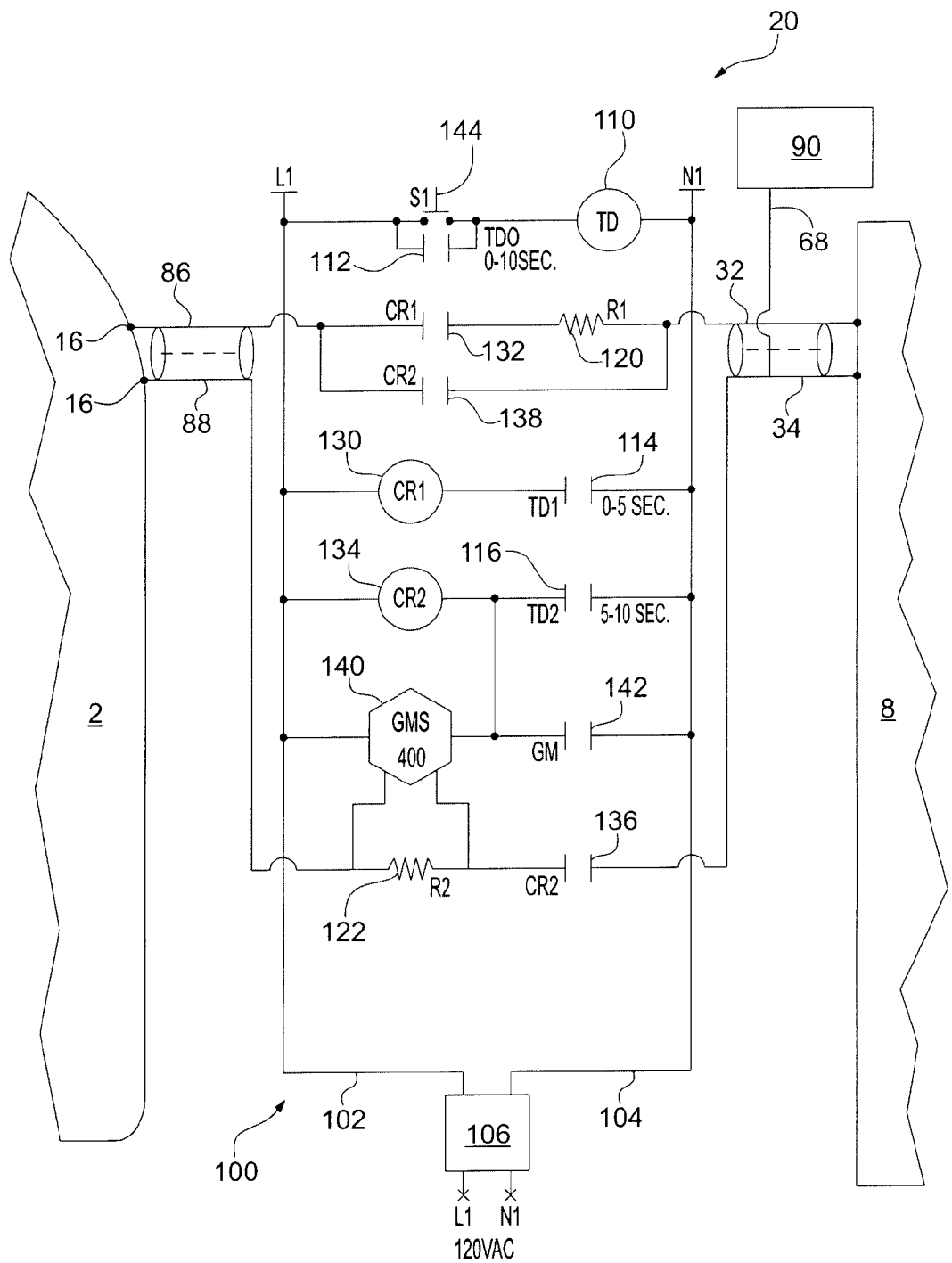
FIG. 4 is a schematic diagram of a primary circuit employed within the system of FIG. 3.
Figure 5:
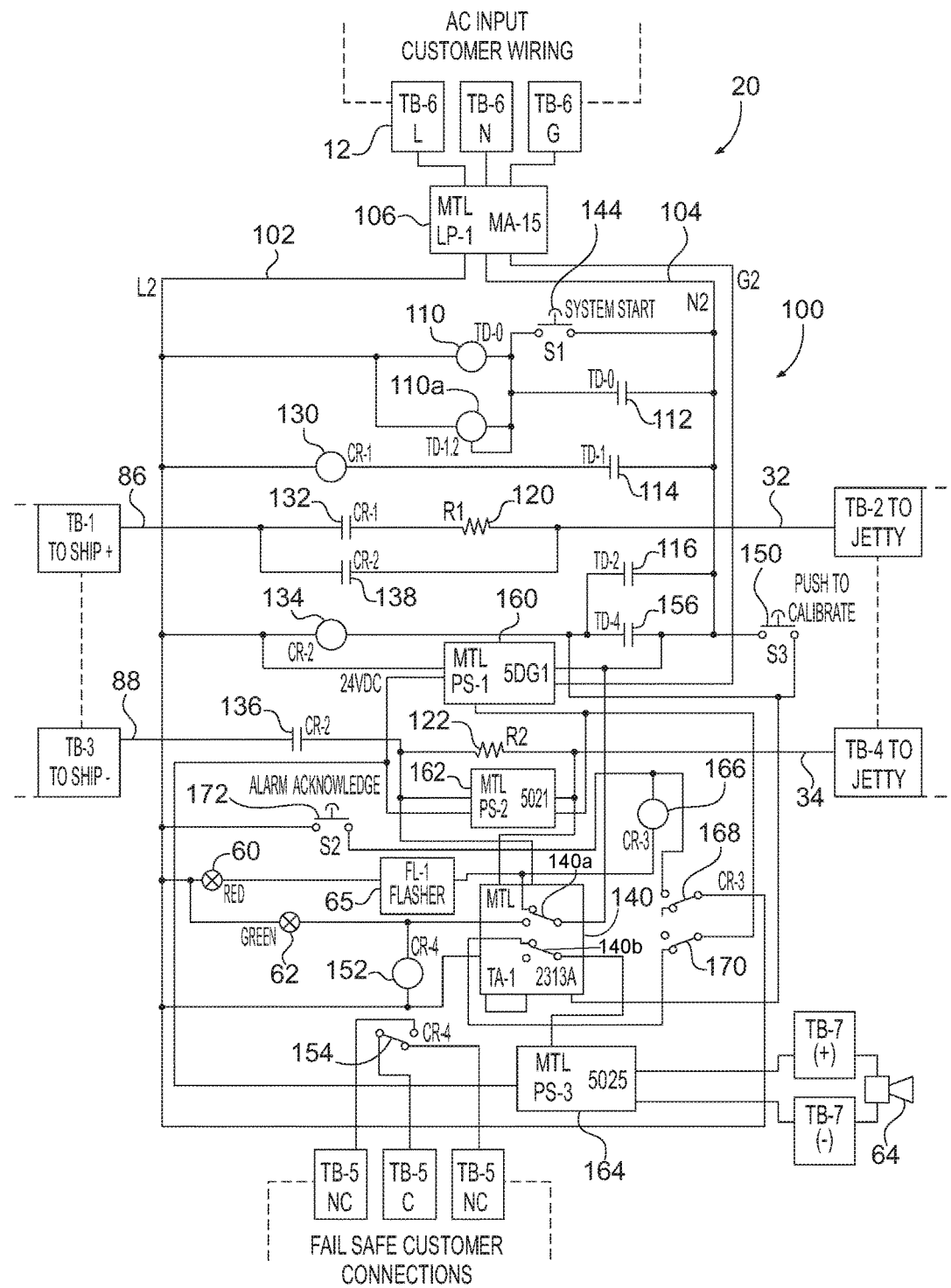
FIG. 5 is a schematic diagram of a detailed circuit employed within the system of FIG. 3.

The control apparatus 30 further contains an electrical control circuit, generally designated as 100, best shown in FIGS. 4-5.

Such control circuit 100 essentially contains electrical components selected, configured and arranged so as to identify potential difference conditions, dissipate excess potential difference to the grounding cell 90, trigger audible alarm 64 and/or visual alarm 62 and, optionally, to trip a normal operation of the system 20.

Now in a particular reference to FIG. 4, therein is illustrated a schematic diagram of a one form of the control circuit 100. The circuit 100 of FIG. 4 may be used in applications where control of the potential difference between the marine vessel 2 and the loading-offloading facility 8 is sufficient. The control circuit 100 includes connections 102 and 104 with a control voltage supply, trough an optional lighting/surge arrestor device 106.

A time delay relay 110 is provided and has a coil thereof coupled to control voltage connections 102, 104. The time delay relay also has normally open (NO) contacts 112, 114 and 116, wherein the NO contact 112 are mounted in series with the coil of the time delay relay 110 for a latching operation. A first resistor 120 is mounted within one of the two wire connections, illustrated by wires 32-86. A second resistor 122 is mounted within another one of the two wire connections, illustrated by wires 34-88. A first control relay 130 is provided and has a coil thereof mounted in series with a normally open contact 114 of time delay relay 110 and has a NO contact 134 thereof mounted in series with the first resistor 120. A second control relay 134 is also provided and has a coil thereof mounted in series with a NO contact 116 of the time delay relay 110 and has a first NO contact 136 thereof mounted in series with the second resistor 122 and has a second NO contact 138 thereof mounted in parallel with the NO contact 132 of the first control relay 130 and the first resistor 120. A resistance differential monitoring device 140 is coupled and configured to measure a resistance across the second resistor 122 and has a NO contact 142 for a latching operation. The circuit 100 further includes a pushbutton switch 144 having a NO contact thereof mounted in series with the coil of the time delay relay 110. The NO contact 112 of time delay relay 110 is than mounted in parallel to the NO contact 144.

FIG. 5 contains a schematic diagram of a more detailed form of the control circuit 100 and also functions to measure potential difference between the supports or pilings 10 of the loading-offloading facility 8, which by a virtue of being set into the ground 6 provide a different resistance values. In addition to the components described above in reference to FIG. 4, the circuit 100 of FIG. 5 includes a "Push to Calibrate" switch 150 having a NO contact. The "Push to Calibrate" switch 150 is provided to change the resistance threshold setting when required. Also shown in FIG. 5 is the resistance differential monitoring device 140 being coupled to a capacitance device 152 represented by a coil and having a pair of contacts 154 and 156. Also shown in FIG. 5 are solenoid/alarm driver 160, available under P/N MTL 5021, and additional solenoid/alarm drivers 162 and 164. Additional relay 166 with contacts 168 and 170 is also provided. Finally, there is a pushbutton switch 172 to acknowledge alarm activation. The time delay 110 may be also provided as a plurality of time delay relays 110 and 110a.

In operation, the control apparatus 30 is first connected to the grounding cell 90, supply of main electrical power from the loading-offloading facility 8 and a grounding portion on such loading-offloading facility 8. After the marine vessel 2 is securely tied to the loading-offloading facility 8, the electrical power is connected to the control apparatus 30 through the connection 12, causing the flashing Red light 60 to turn ON. Next, the apparatus 30 is connected to the grounding plates 16 with cables 88 and 86. The grounding plates 16 may be cleaned, prior to such connection, so as to remove all paint and/or rust scales therefrom. First, wire or cable 88 is connected, establishing a primary electrical bond between the marine vessel 2 and the loading-offloading facility 8. Next, wire or cable 86 is connected to the grounding plates 16 in a proximity to the connection with wire or cable 88 but not touching it. This connection enables the Ground Monitoring System 20 to "measure" a resistance bond between the marine vessel 2 and the loading-offloading facility 8. Next, the pushbutton switch 144 is activated which equalizes the electrical potential between the marine vessel 2 and the loading-offloading facility 8 within a preset amount of time, shown as an example in FIG. 5 as set at 5 seconds. Within this set time, the control apparatus 30 is automatically activated and will operate to insure that a maximum adjustable predetermined (normally 1 to 4 ohms) resistance between the marine vessel 2 and safety ground is not exceeded. The "Green" OK to pump light 62 will illuminate. Should this resistance be exceeded, or the wire or cable 86 ground clamp is loosened or disconnected, this will break the ground bond between the marine vessel 2 and the loading-offloading facility 8, the control apparatus 30 will energize the audible alarm 64 and the visual Red flashing light 64 will activate. The audible alarm 64 may be turned off by depressing the "alarm acknowledge" button 172. In the event that the wire or cable 88 is accidentally disconnected, the wire or cable 86 will hold the bond within the control apparatus 30, through a capacitor device 152 and safety ground is not exceeded, thus enabling operation of the control apparatus 30 during an electrical failure.

The resistance differential monitoring device 140 plays an essential role in operation of the system 20. In a further reference to FIG. 5, the resistance differential monitoring device 140 is connected to the marine vessel 2 through the wire or cable 88 and the NO contact 136 and is further connected to the loading-offloading facility 8 through the wire or cable 34. The resistance differential monitoring device 140 is configured to measure the difference in a resistance potential between two connections and trip the operation of the control apparatus 30 when the difference exceeds the preset threshold. When the circuit 100 is activated, the internal contacts 140*a*, 140*b* change state, with the contact 140*a* activating the green light indicator 62. When the resistance difference exceeds the preset threshold, the contacts 140*a* and 140*b* return to their initial states, as shown in FIG. 5, activating red light indicator 60 and activating the audible alarm 64 through the driver 164.

The pushbutton 172 deactivates audible alarm 64 through the contact 170 of the relay 166 and contact 140*b* of the resistance differential monitoring device 140.

The contact 154 may be provided for disabling of pumping systems in the event of loss of the bond condition.

In a presently preferred embodiment, solenoid/alarm drivers 160 and 162 provide redundancy to the operation of the resistance differential monitoring device 140 and are otherwise considered as an optional devices. Solenoid/alarm driver 160 opens and closes depending on the potential difference from the loading-offloading facility 8 and shutdown the system 20 due to a high charge from the marine vessel 2.

After all fuel transfer and vessel safety operations are concluded, the wires or cables 86 and 88 are disconnected, activating the red light 60 that will start flashing and the audible alarm 64 will also be activated. The pushbutton switch 172 must be then pressed to silence the alarm 64 and turn off red light indicator 60.

It is presently preferred that The Ground Monitor System 20 is capable of detecting a resistance of 0 to approximately 20 ohms between terminals connections with wire or cables 86, 88 as part of the monitored bond to the safety earth. A trimmed 2 ohm calibration resistor set has been installed across these terminals which narrows the 0-20 ohm range to approximately 0-4 ohms. The trip alarm output is generally factory adjusted to detect a resistance over 4.0 ohms.

The system 20 also is configured to change a presently preferred calibration setting of 4.0 ohms by using the "Push to Calibrate" switch 150 and auxiliary calibrated resistance device and an ohmmeter (not shown). The resistance differential monitoring device 140 (manufactured under a model number MTL 2313A by MTL Instruments Group plc, a division of Cooper Industries, of Luton, UK) includes a potentiometer (not shown) that is used to establish a new resistance setting while the "Push to Calibrate" switch 150 is being continually pressed.

It must be noted that should a static ground resistance level detection in excess of 4 ohms be required, a replacement calibration resistor equaling that value should be installed across terminals AVC3 and AVC4 instead of the 2 ohm calibration resistor currently installed.

The Intrinsically Safe Ground Monitoring (ISGM) Ship Board Monitor System 20 has been designed to be "fail-safe" in operation. Should either primary power to the Monitor fail or any of the Monitor System components fail, the alarm relay will close thereby giving an alarm output until the condition is corrected.

The Intrinsically Safe Ground Monitoring System 20 is designed to measure the anti-static bond between a ship tanker and the intrinsically safe loading dock electrolyte and earth ground while in the process of loading or unloading flammable materials. The system continuously assures that a high integrity bond exists when transferring explosive substances between the vessel and the fuel dock.

To further maintain ground integrity, the grounding cell 90 is provided in an anode to cathode electrode of varying shapes and sizes, to dissipate electrical AC/DC charges into the ocean bottom strata 45' feet or deeper.

The system 20 ensures that a maximum adjustable, predetermined (normally 1-4 ohms) resistance between the marine vessel 2 and safety ground is not exceeded. Should this resistance be exceeded, the system 20 will energize an alarm contact output, which activated audible alarm 64 and/or visual alarm 62 and may be used to disable pumping systems. By way of a auxiliary device (not shown) coupled between the control apparatus 30 and the pump 12.

The resistance setting of normally 1-4 ohms can be readjusted to meet other applications, were the ground to structure requirements are different, such as other explosive product types that produce a deferent flow rate, material density and product friction flow.

Thus, the present invention has been described in such full, clear, concise and exact terms as to enable any person skilled in the art to which it pertains to make and use the same. It will be understood that variations, modifications, equivalents and substitutions for components of the specifically described embodiments of the invention may be made by those skilled in the art without departing from the spirit and scope of the invention as set forth in the appended claims.

I claim:

1. A system for monitoring an electrical ground condition between a flammable material loading-offloading facility and a marine vessel partially disposed in a body of water and having a connection with a flammable material pump on said flammable material loading-offloading facility, said system comprising:
   a control apparatus;
   a grounding cell buried within the ocean floor;
   a first connection between said control apparatus and said grounding cell;
   a second connection between said control apparatus and at least one of the loading-offloading facility structure portion and a ground support member inset into the ocean floor and supporting the loading-offloading facility above a water line;
   a third connection between said control apparatus and grounding plates on the marine vessel; and
   said system is being configured to monitor a resistance potential difference between the marine vessel and the at least one of the ocean floor and the flammable material loading-offloading facility structure.

2. The system of claim 1, wherein said control apparatus includes:
(a) connections with a source of a control voltage;
(b) time delay relays, each having a coil thereof coupled to the control voltage;
(c) a first resistor mounted within one of the two wire connections;
(d) a second resistor mounted within another one of the two wire connections;
(e) a first control relay having a coil thereof mounted in series with normally open contacts of one of said time delay relays and having normally open contacts thereof mounted in series with said first resistor;
(f) a second control relay having a coil thereof mounted in series with normally open contacts of another one of said time delay relays and having first normally open contacts thereof mounted in series with said second resistor and having second normally open contacts thereof mounted in parallel with said normally open contacts of said first control relay and said first resistor; and
(g) a resistance differential monitoring device configured to measure a resistance potential difference and at least annunciate a condition wherein said resistance potential difference exceeds a preset threshold value.

3. The system of claim 2, further comprising an indication means for indicating a condition of said resistance differential.

4. The system of claim 3, wherein said indication means includes a pair of light indicators coupled to said resistance differential monitoring device.

5. The system of claim 3, wherein said indication means includes an audible alarm coupled to said resistance differential monitoring device.

6. The system of claim 2, further comprising a pushbutton operable to initiate operation of said control apparatus, wherein coils of said time delay relays are mounted in series with a normally open contact of said pushbutton.

7. The system of claim 2, wherein said resistance differential monitoring device is configured to trip operation of said control apparatus when said resistance potential difference exceeds said preset threshold value.

8. The system of claim 2, wherein said control apparatus comprises solenoid/alarm drivers providing redundancy to operation of said resistance differential monitoring device.

9. The system of claim 1, wherein said second a connection includes connection with two support members, one of said two support members mounted in a proximity to a shore line and another one of said two support members mounted in a proximity to the marine vessel.

10. The system of claim 1, wherein said control apparatus comprises a connection with said flammable material pump, said connection configured to disable an operation of said flammable material pump when said resistance potential difference exceeds said preset threshold value.

11. The system of claim 1, further comprising a pushbutton switch operable to adjust said preset threshold value.

12. The system of claim 1, further comprising a capacitance device mounted and connected within said control apparatus to compensate for a loss of electrical supply thereto.

13. The system of claim 1, wherein said second connection includes one connection between said control apparatus and said loading-offloading facility structure portion and another connection between said control apparatus and said ground support member.

14. The system of claim 1, said system configured to maintain an equilibrium between the marine vessel and a source of electrical power from the flammable material loading-offloading facility.

15. The system of claim 1, wherein said third connection comprises an explosion proof housing, a reel contained within a hollow interior of said explosion proof housing and a pair of wires or cables on said real for a connection to the grounding plates during loading-offloading of the marine vessel.

16. The system of claim 1, wherein said control apparatus comprises a control circuit comprising electrical components selected, configured and arranged so as to identify a resistance potential difference conditions, dissipate excess resistance potential difference to said grounding cell, and trigger an audible alarm and/or visual alarm.

17. The system of claim 16, wherein said control circuit is configured to trip a normal operation of said system.

18. The system of claim 1, wherein said control apparatus comprises a control circuit comprising electrical components selected, configured and arranged so as to measure said resistance potential difference between supports or pilings of the loading-offloading facility, dissipate excess resistance potential difference to said grounding cell, and trigger an audible alarm and/or visual alarm.

19. A method for monitoring an electrical ground condition between a marine vessel partially disposed in a body of water and at least one of an ocean floor and a loading-offloading facility, said method comprising the steps of:
(a) burying at least one ground cell into said ocean floor;
(b) coupling a control apparatus to said at least one load cell, grounding plates on said marine vessel and at least one of said loading-offloading facility and a support structure therefor;
(c) monitoring, with said control apparatus, a resistance differential between said marine vessel and said at least one of said ocean floor and said loading-offloading facility; and
(d) annunciating a condition wherein said monitored resistance differential exceeds a preset threshold value.

* * * * *